United States Patent
Baba

(10) Patent No.: US 11,832,384 B2
(45) Date of Patent: Nov. 28, 2023

(54) MULTILAYER RESIN SUBSTRATE AND METHOD OF MANUFACTURING MULTILAYER RESIN SUBSTRATE

(71) Applicant: Murata Manufacturing Co., Ltd., Nagaokakyo (JP)

(72) Inventor: Takahiro Baba, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 96 days.

(21) Appl. No.: 17/518,671

(22) Filed: Nov. 4, 2021

(65) Prior Publication Data

US 2022/0061156 A1 Feb. 24, 2022

Related U.S. Application Data

(63) Continuation of application No. PCT/JP2020/024580, filed on Jun. 23, 2020.

(30) Foreign Application Priority Data

Jun. 27, 2019 (JP) .................................. 2019-119963

(51) Int. Cl.
*H05K 1/02* (2006.01)
*H05K 1/03* (2006.01)

(52) U.S. Cl.
CPC .................. *H05K 1/036* (2013.01)

(58) Field of Classification Search
CPC ........ H05K 1/036; H05K 1/118; H05K 1/147; H05K 1/189
See application file for complete search history.

(56) References Cited

U.S. PATENT DOCUMENTS

| | | | | |
|---|---|---|---|---|
| 10,664,015 | B2 * | 5/2020 | Choi | G06F 1/1652 |
| 2006/0237225 | A1 * | 10/2006 | Kariya | H01L 23/49827 174/262 |
| 2008/0247703 | A1 * | 10/2008 | Kodama | G02B 6/4214 385/14 |
| 2013/0127560 | A1 | 5/2013 | Kato et al. | |
| 2015/0351222 | A1 * | 12/2015 | Baba | H01L 25/10 333/238 |

(Continued)

FOREIGN PATENT DOCUMENTS

| | | |
|---|---|---|
| JP | 2009-176901 A | 8/2009 |
| JP | 2015-012098 A | 1/2015 |

(Continued)

OTHER PUBLICATIONS

Official Communication issued in International Patent Application No. PCT/JP2020/024580, dated Sep. 15, 2020.

*Primary Examiner* — Hoa C Nguyen
(74) *Attorney, Agent, or Firm* — KEATING & BENNETT, LLP

(57) ABSTRACT

A multilayer resin substrate includes a stacked body including first resin layers made of a thermoplastic resin, conductor patterns on the stacked body, and a protective layer including a second resin layer made of a thermosetting resin. The stacked body includes first and second main surfaces, and a bent portion. One of the conductor patterns located at the bent portion is located only inside the stacked body. The protective layer covers at least the bent portion, on the main surface of the stacked body.

16 Claims, 13 Drawing Sheets

(56) References Cited

U.S. PATENT DOCUMENTS

| | | | |
|---|---|---|---|
| 2015/0380679 A1* | 12/2015 | Fujiyoshi | H10K 77/111 438/26 |
| 2017/0084974 A1 | 3/2017 | Baba et al. | |
| 2017/0194076 A1 | 7/2017 | Yosui et al. | |
| 2017/0279192 A1 | 9/2017 | Taniguchi et al. | |
| 2018/0123206 A1* | 5/2018 | Yosui | H01L 23/66 |
| 2018/0258324 A1 | 9/2018 | Tochihira et al. | |
| 2019/0191553 A1 | 6/2019 | Awaji | |
| 2021/0183840 A1* | 6/2021 | Wang | H10K 71/00 |

FOREIGN PATENT DOCUMENTS

| | | |
|---|---|---|
| JP | 2018-026493 A | 2/2018 |
| WO | 2012/074101 A1 | 6/2012 |
| WO | 2015186720 A1 | 12/2015 |
| WO | 2016056496 A1 | 4/2016 |
| WO | 2016/117554 A1 | 7/2016 |
| WO | 2016/203842 A1 | 12/2016 |

\* cited by examiner

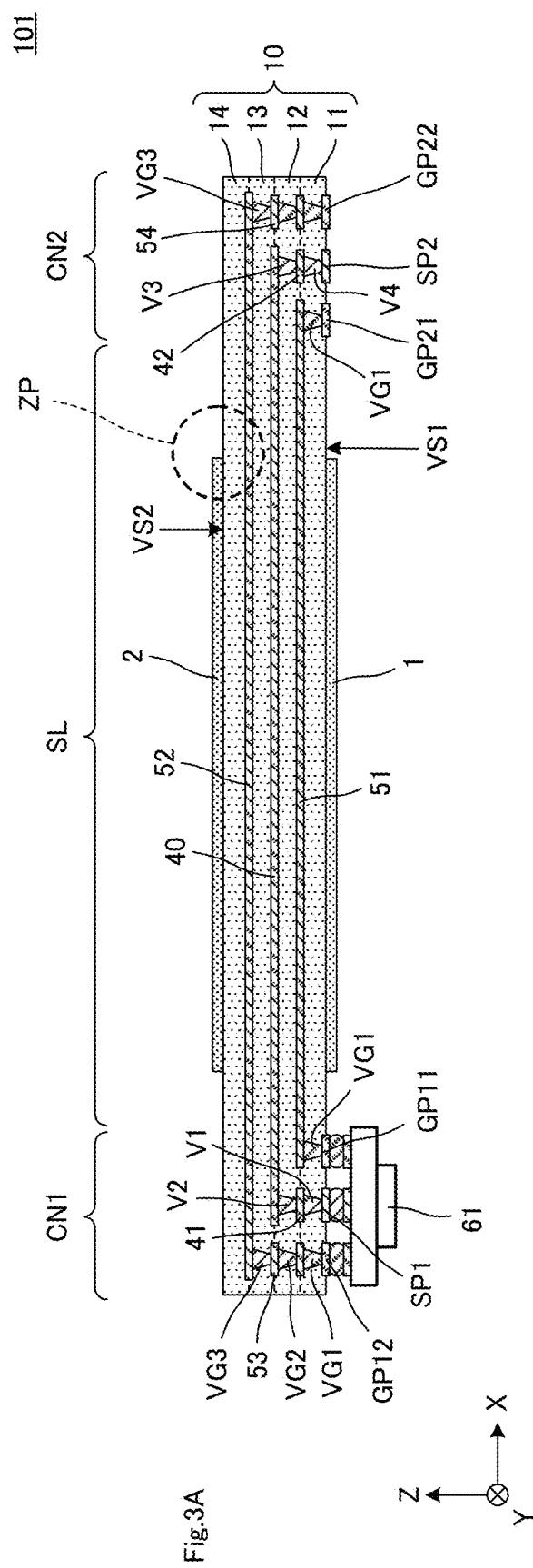
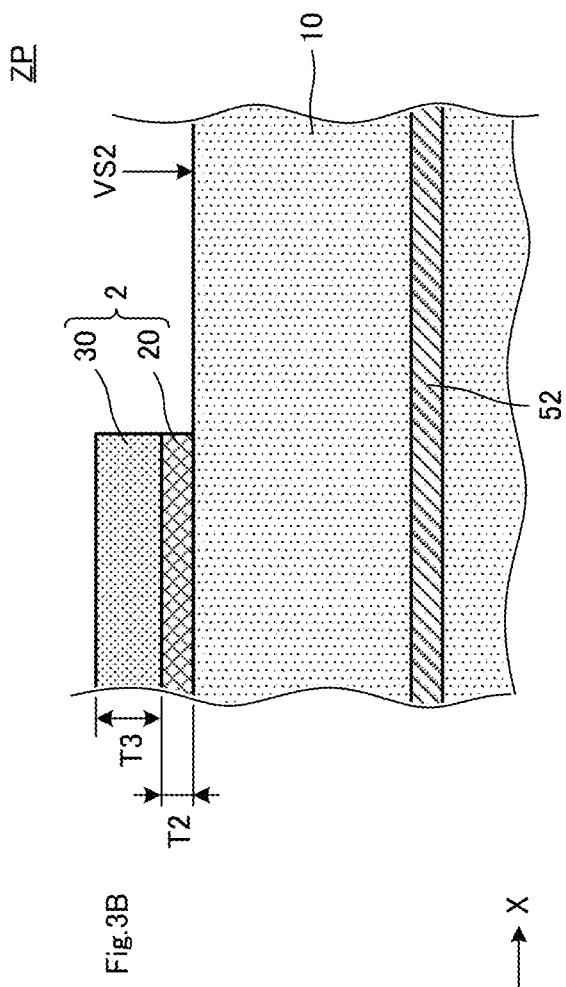
Fig.3A
Fig.3B

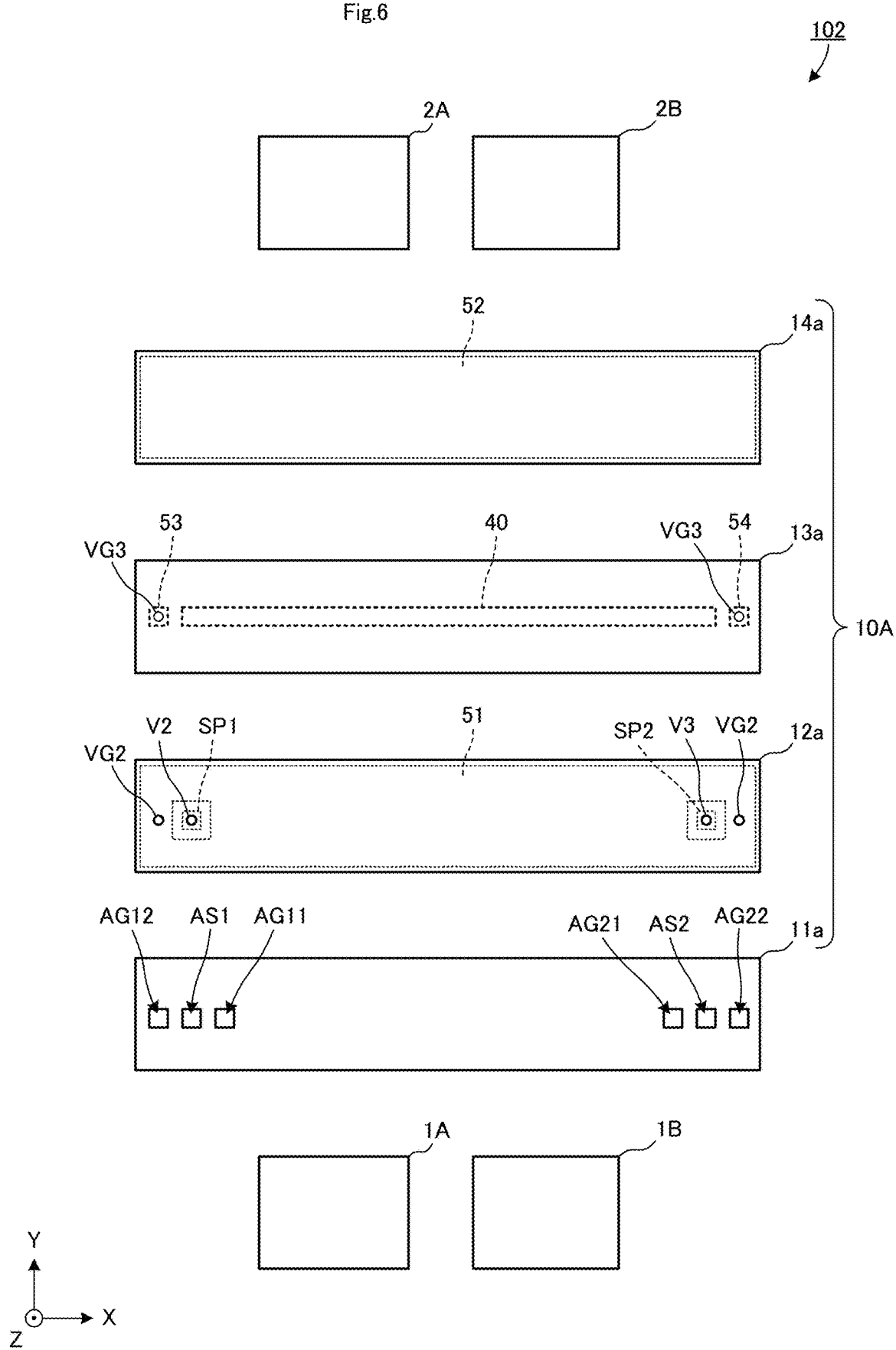

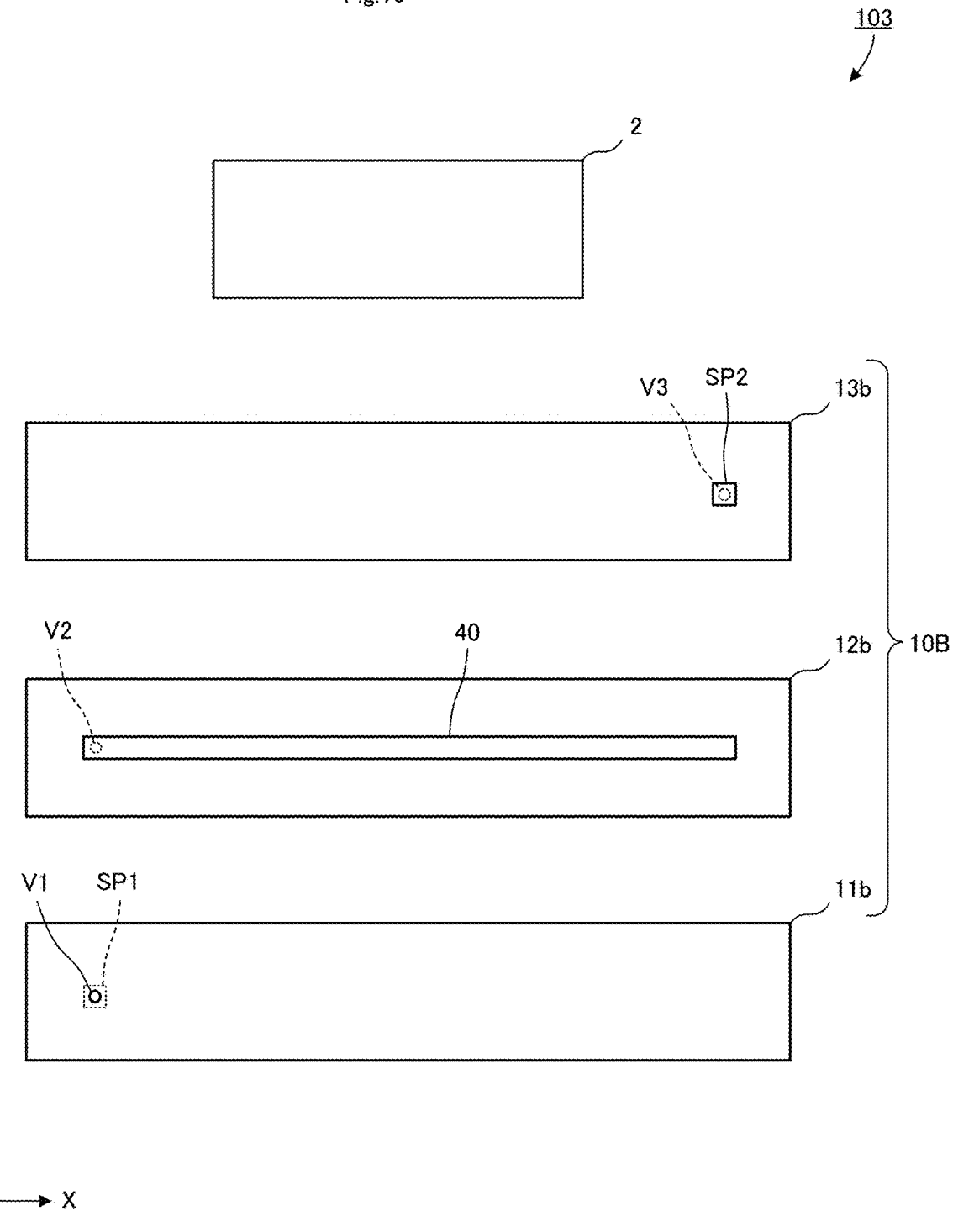

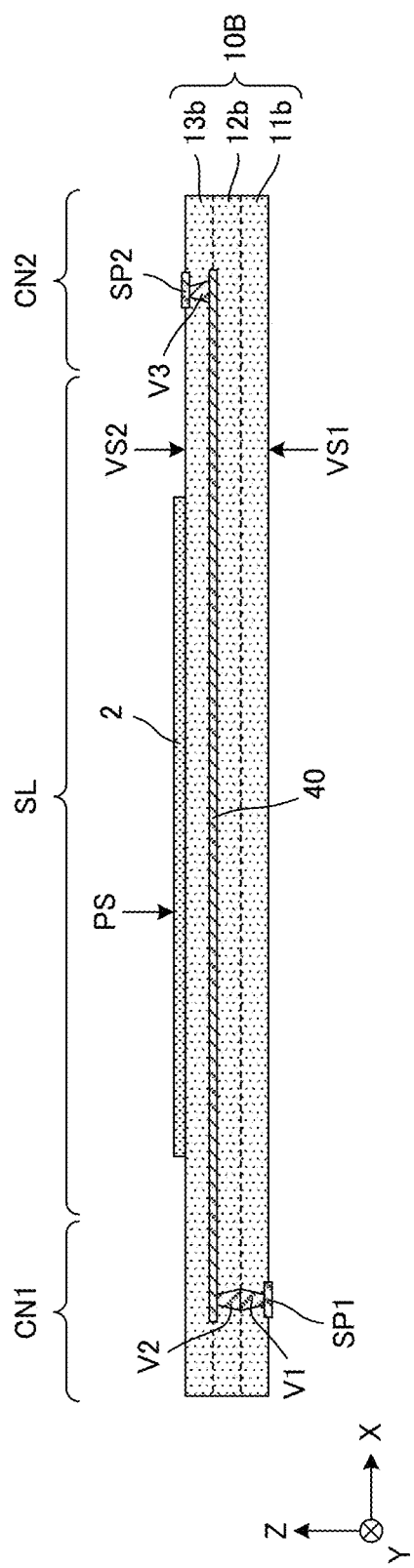
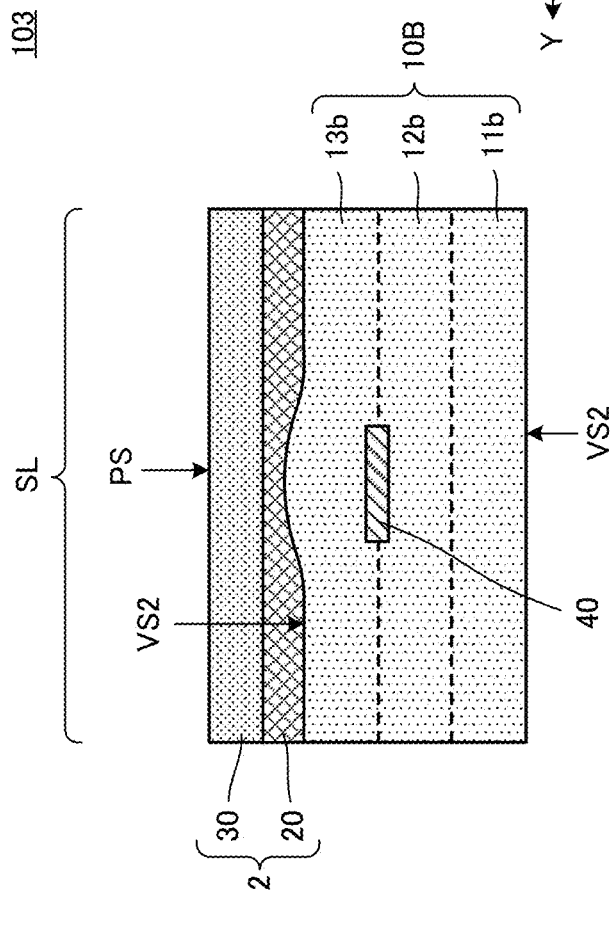
Fig.11A
Fig.11B

MULTILAYER RESIN SUBSTRATE AND METHOD OF MANUFACTURING MULTILAYER RESIN SUBSTRATE

CROSS REFERENCE TO RELATED APPLICATIONS

This application claims the benefit of priority to Japanese Patent Application No. 2019-119963 filed on Jun. 27, 2019 and is a Continuation Application of PCT Application No. PCT/JP2020/024580 filed on Jun. 23, 2020. The entire contents of each application are hereby incorporated herein by reference.

BACKGROUND OF THE INVENTION

1. Field of the Invention

The present invention relates to a multilayer resin substrate including a stacked body including a plurality of resin layers, and a protective layer on a surface of the stacked body, and a method of manufacturing such a multilayer resin substrate.

2. Description of the Related Art

Conventionally, a multilayer resin substrate including a stacked body provided by stacking a plurality of resin layers, a conductor pattern provided on the stacked body, and a protective layer provided on a surface of the stacked body has been known.

For example, International Publication No. 2012/074101 discloses a multilayer resin substrate including a stacked body provided by stacking a plurality of resin layers, a conductor pattern provided on a surface of the stacked body, and a protective layer provided on the surface of the stacked body so as to cover the conductor pattern and including an opening at a position corresponding to an external connection electrode. The protective layer, after the stacked body is provided, is provided by being applied (or attached) to the surface of the stacked body and then being heated and cured.

It is to be noted that the multilayer resin substrate has flexibility and may be bent. Therefore, the protective layer provided on the surface of the stacked body requires not only workability for being easily provided but also flexibility. However, in a case in which the multilayer resin substrate disclosed in International Publication No. 2012/074101 is bent, large bending stress is applied to the protective layer provided on the surface of the stacked body, which may cause a crack in the protective layer. Then, when the crack occurs in a portion of the protective layer in contact with the conductor pattern provided on the surface of the stacked body, the conductor pattern is also cracked, and electrical characteristics of the multilayer resin substrate may change.

SUMMARY OF THE INVENTION

Preferred embodiments of the present invention provide multilayer resin substrates in each of which, in a configuration in which a protective layer is provided on a surface of a stacked body, the protective layer is able to be easily provided, and, even when the protective layer is cracked during bending processing, variations in electrical characteristics are able to be reduced.

A multilayer resin substrate according to a preferred embodiment of the present invention includes a stacked body having a main surface and including a plurality of first resin layers made of a thermoplastic resin, one or more conductor patterns in or on the stacked body, and a protective layer at a portion of the main surface and including a second resin layer made of a thermosetting resin, and the stacked body includes a bent portion, a conductor pattern at the bent portion, among the one or more conductor patterns, is provided only inside the stacked body, and the protective layer covers at least the bent portion, on the main surface.

According to this configuration, the conductor pattern is not provided on the main surface of the stacked body in the bent portion, so that, even when the stacked body is bent and thus the protective layer is cracked, cracking or peeling of the conductor pattern is significantly reduced or prevented, and variations in the electrical characteristics of the multilayer resin substrate are able to be significantly reduced or prevented. In addition, the protective layer covers the bent portion, so that the conductor pattern located at the bent portion is able to be brought much closer to an inner layer (a neutral surface). Therefore, it is possible to make it difficult to apply bending stress to the conductor pattern, and to further reduce or prevent a crack or the like of the conductor pattern due to bending of the multilayer resin substrate. In such a manner, the conductor pattern located at the bent portion is able to be easily protected simply by providing the protective layer at the position to cover the bent portion.

According to each of preferred embodiments of the present invention, in a configuration in which a protective layer is provided on a surface of a stacked body, a multilayer resin substrate is provided in which the protective layer is able to be easily provided, and, even when the protective layer is cracked during bending processing, variations in electrical characteristics are able to be significantly reduced or prevented.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3A is an A-A cross-sectional view in FIG. 1B, and FIG. 3B is an enlarged view of a ZP portion in FIG. 3A.

FIG. 6 is an exploded plan view of the multilayer resin substrate 102.

FIG. 10 is an exploded plan view of the multilayer resin substrate 103.

FIG. 11A is a C-C cross-sectional view in FIG. 9B, and FIG. 11B is a D-D cross-sectional view in FIG. 9B.

DETAILED DESCRIPTION OF THE PREFERRED EMBODIMENTS

Figure 1A:
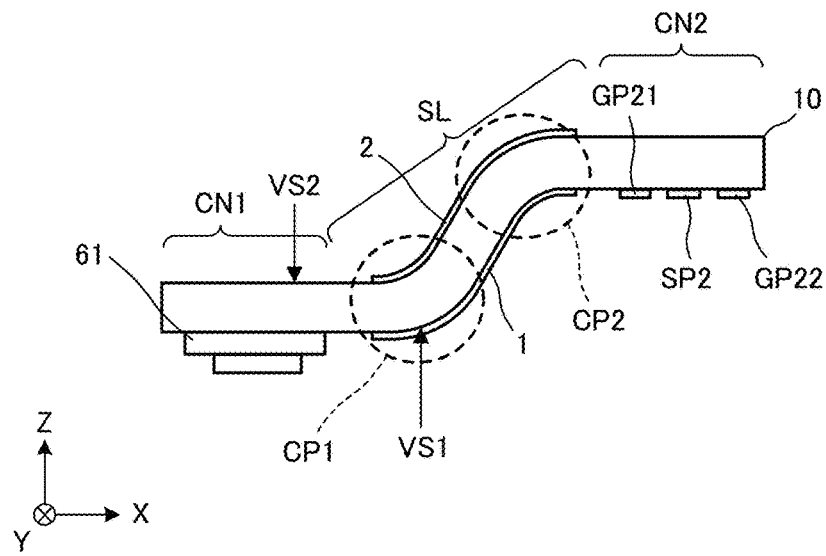
FIG. 1A is a front view of a multilayer resin substrate 101 according to a first preferred embodiment of the present invention.

Hereinafter, preferred embodiments of the present invention will be described with reference to the attached drawings and several specific examples. In the drawings, components and elements assigned with the same reference numerals or symbols will represent the same or corresponding components and elements. While preferred embodiments of the present invention are divided and described for the sake of convenience in consideration of ease of description or understanding of main points, elements described in different preferred embodiments are able to be partially replaced and combined with each other. In second and subsequent preferred embodiments, a description of matters common to the first preferred embodiment will be omitted and only different points will be described. In particular, the same or substantially the same advantageous functions and effects by the same or similar configurations will not be described one by one for each preferred embodiment.

First Preferred Embodiment

Figure 1B:
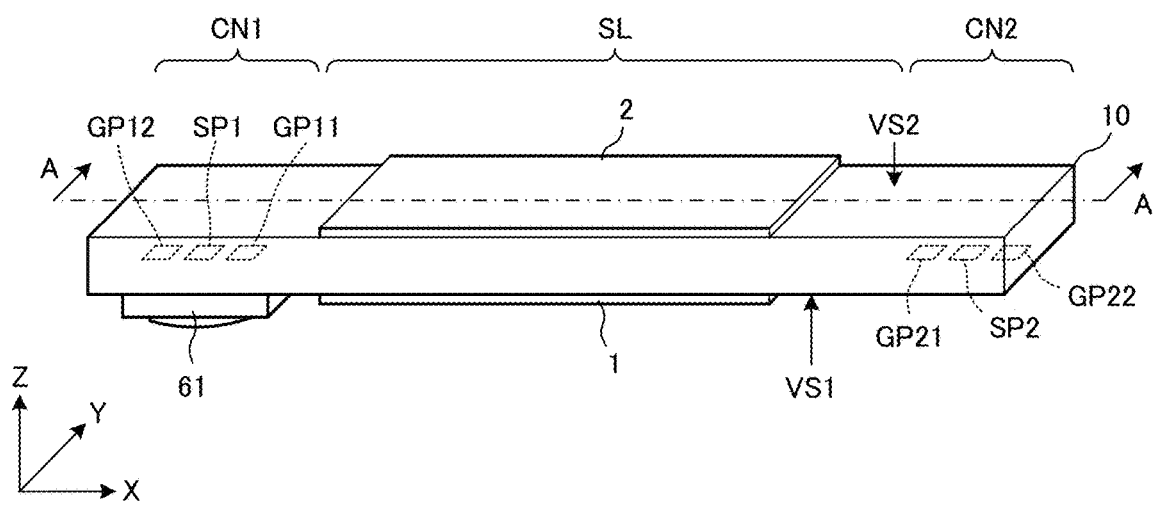
FIG. 1B is an external perspective view showing a state before the multilayer resin substrate 101 is bent.
Figure 2:
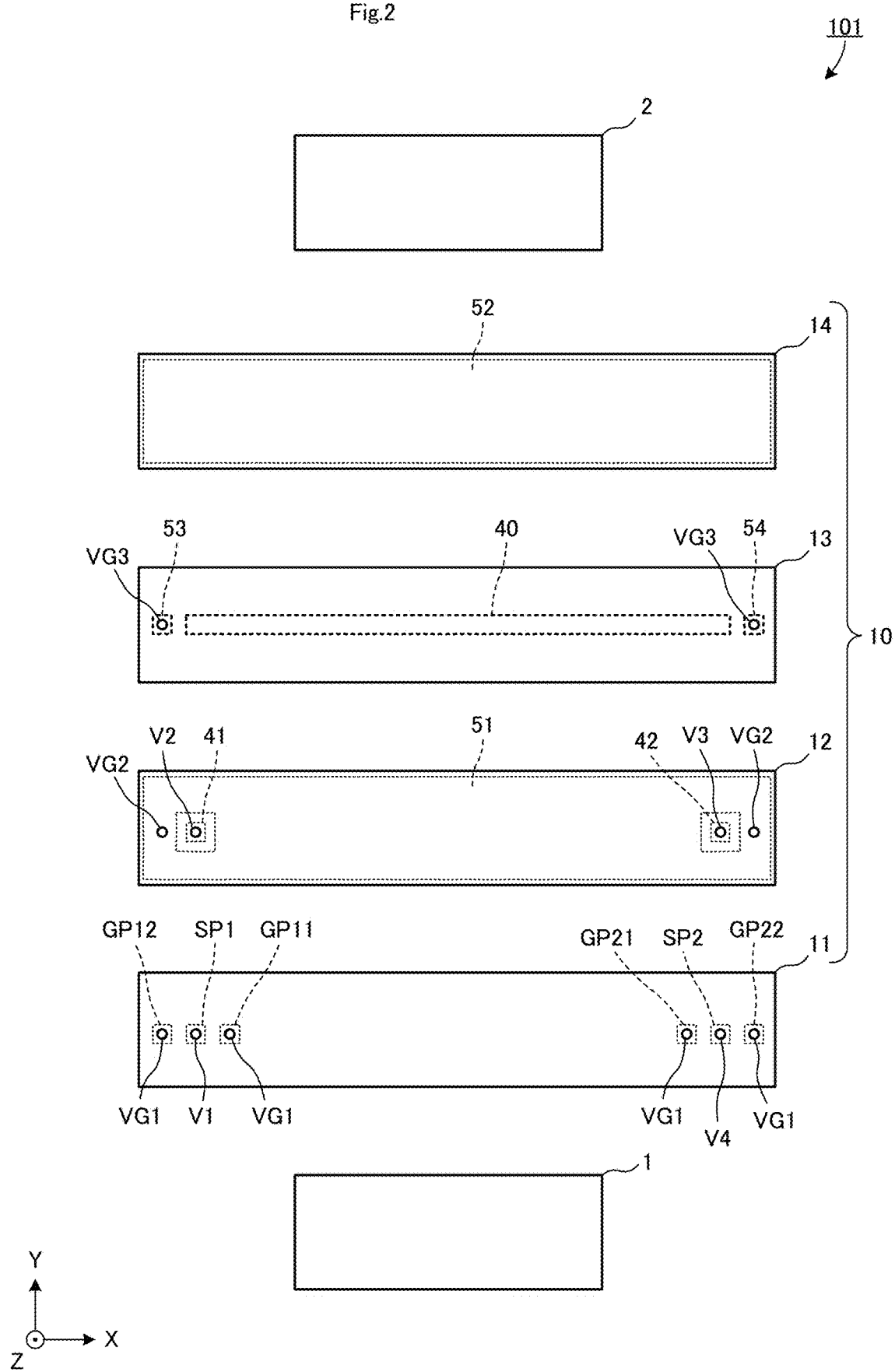
FIG. 2 is an exploded plan view of the multilayer resin substrate 101.

FIG. 1A is a front view of a multilayer resin substrate 101 according to a first preferred embodiment of the present invention, and FIG. 1B is an external perspective view showing a state before the multilayer resin substrate 101 is bent. FIG. 2 is an exploded plan view of the multilayer resin substrate 101. FIG. 3A is an A-A cross-sectional view in FIG. 1B, and FIG. 3B is an enlarged view of a ZP portion in FIG. 3A.

The multilayer resin substrate 101 according to the first preferred embodiment of the present invention may be a cable that connects a plurality of circuit boards to each other, for example.

The multilayer resin substrate 101 includes connection portions CN1 and CN2, and a line portion SL. The connection portions CN1 and CN2 are connected to other circuit boards. As will be described in detail later, a transmission line that connects the connection portions CN1 and CN2 is provided in the line portion SL. In the multilayer resin substrate 101, the connection portion CN1, the line portion SL, and the connection portion CN2 are disposed in this order in a positive X direction.

The multilayer resin substrate 101 includes a stacked body 10, a conductor pattern (signal conductors 40, 41, and 42, ground conductors 51, 52, 53, and 54, and external connection electrodes SP1, SP2, GP11, GP12, GP21, and GP22), interlayer connection conductors V1, V2, V3, V4, VG1, VG2, and VG3, protective layers 1 and 2, and a plug 61.

The stacked body 10 is a flat plate having a rectangular or substantially rectangular shape of which the longer direction coincides with an X-axis direction and has a first main surface VS1 and a second main surface VS2 that oppose each other. The external connection electrodes SP1, GP11, and GP12 are provided on the first main surface VS1 of the connection portion CN1, and the external connection electrodes SP2, GP21, and GP22 are provided on the first main surface VS1 of the connection portion CN2. Signal conductors 40 to 42, ground conductors 51 to 54, and the interlayer connection conductors V1 to V4 and VG1 to VG3 are provided inside the stacked body 10. The protective layer 1 is provided on the first main surface VS1 of the line portion SL, and the protective layer 2 is provided on the second main surface VS2 of the line portion SL.

The stacked body 10 includes a plurality of first resin layers 11, 12, 13, and 14 that are stacked in this order. The plurality of first resin layers 11 to 14 are flat plates made of, for example, a thermoplastic resin and having a rectangular or substantially rectangular shape of which the longer direction coincides with the X-axis direction, and each have flexibility. As shown in FIG. 1A, the stacked body 10 is bent into an S shape. Specifically, the stacked body 10 includes a plurality of bent portions CP1 and CP2 in the line portion SL. The bent portion CP1 is bent in a stacking direction (a Z-axis direction) so that the second main surface VS2 may be inside. The bent portion CP2 is bent in the stacking direction so that the first main surface VS1 may be inside. The bent portions CP1 and CP2 are disposed in this order in the longer direction. The bent portions CP1 and CP2 are located between the external connection electrode SP1 and the external connection electrode SP2 in the X-axis direction. The plurality of first resin layers 11 to 14 are sheets of which the main material is, for example, a liquid crystal polymer (LCP) or polyetheretherketone (PEEK).

The external connection electrodes SP1, SP2, GP11, GP12, GP21, and GP22 are provided on a back surface of the first resin layer 11. The external connection electrodes SP1, GP11, and GP12 are rectangular or substantially rectangular conductor patterns disposed in the vicinity of a first end (a left end of the first resin layer 11 in FIG. 2) of the first resin layer 11. The external connection electrodes GP12, SP1, and GP11 are disposed in this order in the positive X direction. The external connection electrodes SP2, GP21, and GP22 are rectangular or substantially rectangular conductor patterns disposed in the vicinity of a second end (a right end of the first resin layer 11 in FIG. 2) of the first resin layer 11. The external connection electrodes GP21, SP2, and GP22 are disposed in this order in the positive X direction. The external connection electrodes SP1, SP2, GP11, GP12, GP21, and GP22 are conductor patterns such as Cu foil, for example.

In addition, the interlayer connection conductors V1 and V4 and the plurality of interlayer connection conductors VG1 are provided in the first resin layer 11.

The signal conductor 41 and 42 and the ground conductor 51 are provided on a back surface of the first resin layer 12. The signal conductor 41 is a rectangular or substantially rectangular conductor pattern disposed in the vicinity of a first end (a left end of the first resin layer 12 in FIG. 2) of the first resin layer 12. The signal conductor 42 is a rectangular or substantially rectangular conductor pattern disposed in the vicinity of a second end (a right end of the first resin layer 12 in FIG. 2) of the first resin layer 12. The ground conductor 51 is a conductor pattern provided on the entire or substantially the entire surface of the first resin layer 12. The signal conductors 41 and 42 and the ground conductor 51 may be conductor patterns such as Cu foil, for example.

In addition, the interlayer connection conductors V2 and V3 and the plurality of interlayer connection conductors VG2 are provided in the first resin layer 12.

The signal conductor 40 and the ground conductors 53 and 54 are provided on a back surface of the first resin layer 13. The signal conductor 40 is a linear conductor pattern extending in a transmission direction (the X-axis direction). The ground conductor 53 is a rectangular or substantially rectangular conductor pattern disposed in the vicinity of a first end (a left end of the first resin layer 13 in FIG. 2) of the first resin layer 13. The ground conductor 54 is a rectangular or substantially rectangular conductor pattern disposed in the vicinity of a second end (a right end of the first resin layer 13 in FIG. 2) of the first resin layer 13. The signal conductor 40 and the ground conductors 53 and 54 may be conductor patterns such as Cu foil, for example. As described above, the conductor pattern includes the ground conductor 51 (a first ground conductor), the ground conductor 52 (a second ground conductor), and the signal conductor 40 (a first signal conductor) located between the ground conductor 51 and the ground conductor 52 in the stacking direction of the stacked body 10.

In addition, the plurality of interlayer connection conductors VG3 are provided in the first resin layer 13.

The ground conductor 52 is provided on a back surface of the first resin layer 14. The ground conductor 52 is a conductor pattern provided on the entire or substantially the entire surface of the first resin layer 14. The ground conductor 52 may be a conductor pattern such as Cu foil, for example.

The protective layer 1 is a protective film that covers a portion of the back surface (the first main surface VS1) of the first resin layer 11, and the protective layer 2 is a protective film that covers a portion of a front surface (the second main surface VS2) of the first resin layer 14. The protective layers 1 and 2 are disposed at a position to cover at least the bent portions CP1 and CP2. The protective layers 1 and 2 according to the present preferred embodiment of the present invention are disposed on the entire or substantially the entire line portion SL of the first main surface VS1 or the second main surface VS2. Therefore, each apex of the bent portions CP1 and CP2 is spaced away from both ends of each of the protective layers 1 and 2 in the X-axis direction. Each apex of the bent portions CP1 and CP2 is a portion at which a curvature of the bent portions CP1 and CP2 is maximized. As a result, the both ends of the protective layers 1 and 2 in the X-axis direction are largely bent, which significantly reduces or prevents the protective layers 1 and 2 from being separated. In addition, each apex of the bent portions CP1 and CP2 is preferably close to the center of the protective layers 1 and 2 in the X-axis direction.

As shown in FIG. 3B, the protective layer 2 includes a second resin layer 20 and a third resin layer 30 that are adjacent to each other. The second resin layer 20 is an adhesive layer made of, for example, a thermosetting resin to bond the third resin layer 30 to the stacked body 10. The third resin layer 30 is more flexible (Young's modulus is low) than the second resin layer 20, and is bonded (attached or disposed) to the second main surface VS2 through the second resin layer 20. Although not illustrated, the protective layer 1 also includes a second resin layer and a third resin layer. In the present preferred embodiment, as shown in FIG. 3B, a thickness (T2) of the second resin layer 20 is less than a thickness (T3) of the third resin layer 30 (T2<T3). The third resin layer 30 is a sheet of which the main material is, for example, polyimide (PI).

The plug 61 is mounted on the first main surface VS1 (the back surface of the first resin layer 11) of the connection portion CN1. The plug 61 is connected to the external connection electrodes SP1, GP11, and GP12 through a conductive bonding material, such as solder, for example.

The external connection electrodes SP1 and SP2 are electrically connected to each other. Specifically, the external connection electrode SP1 is connected to a first end (a left end of the signal conductor 40 in FIG. 3A) of the signal conductor 40 through the signal conductor 41 and the interlayer connection conductors V1 and V2. A second end (a right end of the signal conductor 40 in FIG. 3A) of the signal conductor 40 is connected to the external connection electrode SP2 through the signal conductor 42 and the interlayer connection conductors V3 and V4. In addition, each of the external connection electrodes GP11, GP12, GP21, and GP22 is connected to the ground conductor 51 through the interlayer connection conductor VG1. The ground conductors 51 and 52 are electrically connected through the ground conductors 53 and 54 and the interlayer connection conductors VG2 and VG3.

In the line portion SL of the multilayer resin substrate 101, a transmission line having a stripline structure is provided which includes the signal conductor 40, the ground conductors 51 and 52, the first resin layer 12 interposed between the signal conductor 40 and the ground conductor 51, and the first resin layer 13 interposed between the signal conductor 40 and the ground conductor 52.

A conductor pattern (the signal conductor 40 and the ground conductors 51 and 52) located at the bent portions CP1 and CP2, among the conductor patterns, is provided inside of the stacked body 10. Therefore, the protective layers 1 and 2 are not in contact with the conductor pattern at the bent portions CP1 and CP2. The protective layers 1 and 2 according to the present preferred embodiment of the present invention are also not (are not disposed near the external connection electrodes SP1, SP2, GP11, GP12, GP21, and GP22) in contact with the external connection electrodes SP1, SP2, GP11, GP12, GP21, and GP22.

Figure 4:
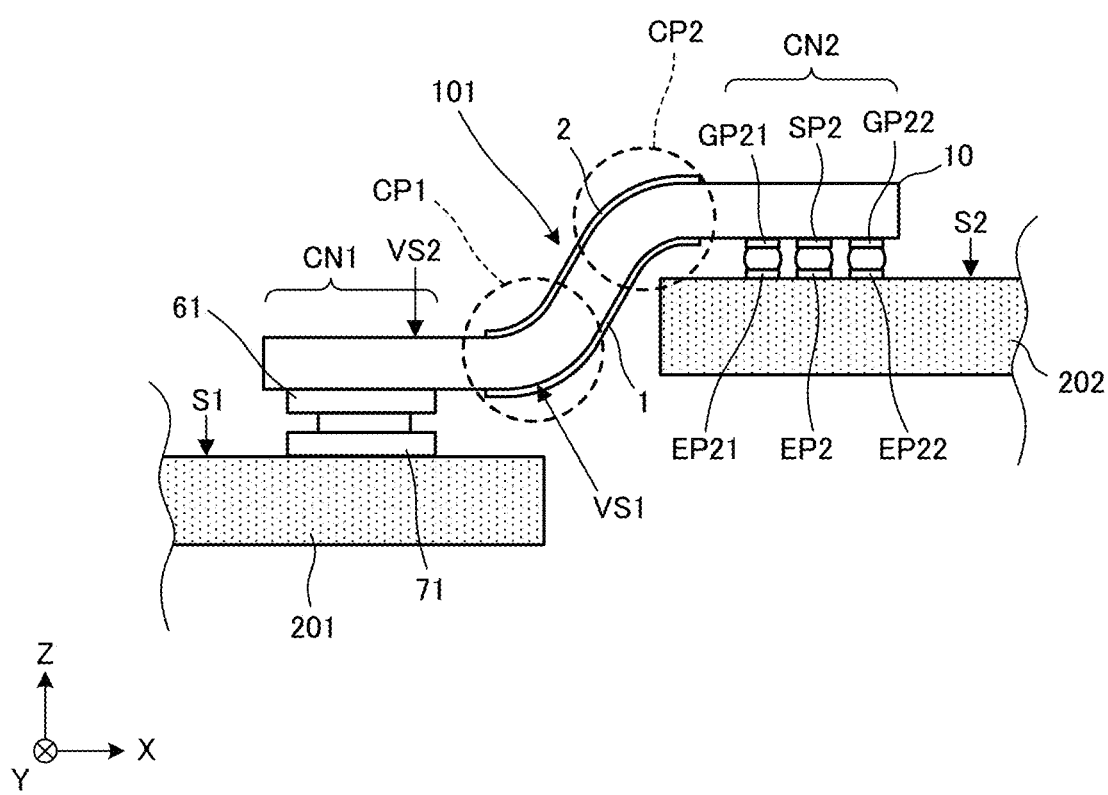
FIG. 4 is a front view showing a main portion of an electronic device 301 according to the first preferred embodiment of the present invention.

The multilayer resin substrate 101 is used, for example, as follows. FIG. 4 is a front view showing a main portion of an electronic device 301 according to the first preferred embodiment.

The electronic device 301 includes the multilayer resin substrate 101 and circuit boards 201 and 202. The circuit boards 201 and 202 are glass epoxy substrates, for example. The electronic device 301 also includes other components, which are not shown in FIG. 4. The same applies to each of the front views showing a main portion of the subsequent electronic device.

The circuit board 201 includes a first surface S1, and the circuit board 202 includes a second surface S2. As shown in FIG. 4, both of the first surface S1 and the second surface S2 are parallel or substantially parallel to an XY plane, and have different heights in the Z-axis direction. A receptacle 71 is disposed on the first surface S1 of the circuit board 201. External electrodes EP2, EP21, and EP22 are provided on the second surface S2 of the circuit board 202.

The connection portions CN1 and CN2 of the multilayer resin substrate 101 are mounted on the circuit boards 201 and 202. Specifically, the plug 61 of the multilayer resin substrate 101 is connected to the receptacle 71 of the circuit board 201. The external connection electrodes SP2, GP21, and GP22 of the multilayer resin substrate 101 are respectively connected to the external electrodes EP2, EP21, and EP22 of the circuit board 202 through the conductive bonding material.

In such a manner, the circuit boards 201 and 202 are connected to each other through the multilayer resin substrate 101. In addition, since the multilayer resin substrate 101 includes the bent portions CP1 and CP2 (that is, being bent), it is easily mounted on the circuit boards 201 and 202 that include surfaces of which the heights are different from each other.

According to the multilayer resin substrate 101 of the present preferred embodiment, the following advantageous effects are obtained.

(a) In the present preferred embodiment, the protective layer 1 covers the bent portions CP1 and CP2 on the first main surface VS1, and the protective layer 2 covers the bent portions CP1 and CP2 on the second main surface VS2. In addition, in the present preferred embodiment, the conductor pattern (the signal conductor 40 and the ground conductors 51 and 52) located at the bent portions CP1 and CP2 is only provided inside the stacked body 10, and is not disposed on a main surface. According to this configuration, the conductor pattern is not provided on the main surface of the stacked body 10 in the bent portions CP1 and CP2, so that, even when the stacked body is bent and thus the protective layer is cracked, cracking or peeling of the conductor pattern is significantly reduced or prevented, and the variations in the electrical characteristics of the multilayer resin substrate are able to be significantly reduced or prevented. In addition, the protective layers 1 and 2 cover the bent portions CP1 and CP2, so that the conductor pattern located at the bent portions CP1 and CP2 is able to be brought much closer to an inner layer (a neutral surface). Therefore, it is possible to make it difficult to apply bending stress to the conductor pattern, and to further reduce or prevent a crack or the like of the conductor pattern due to bending of the multilayer resin substrate 101 (the stacked body 10). In such a manner, the conductor pattern located at the bent portions CP1 and CP2 is able to be easily protected simply by providing the protective layers 1 and 2 at a position to cover the bent portions CP1 and CP2.

As will be described in detail later, the protective layers 1 and 2 are attached to the main surface of the stacked body 10 and heated and the second resin layer 20 of the protective layers 1 and 2 is cured, and then the multilayer resin substrate 101 is bent. Therefore, the second resin layer 20 with relatively low flexibility among the protective layers 1 and 2 is easily cracked or separated when the multilayer resin substrate 101 is bent. However, a local crack or the like occurring in the second resin layer 20 significantly reduces or prevents bending stress from being applied to other portions, which results in significantly reducing or preventing the occurrence of the crack or the like of the conductor pattern located at the bent portion.

In a case in which a stacked body in which a portion to be a bent portion is thicker than other portions is provided, a manufacturing process may become more complicated, such as preparing a plurality of first resin layers with different shapes. In contrast, the multilayer resin substrate 101 according to the present preferred embodiment, as will be described in detail later, is easy to be manufactured because the thickness of the bent portion is able to be increased simply by providing the protective layer on the main surface of the stacked body 10.

(b) Typically, a coverlay film is attached to the entire or substantially the entire main surface of a stacked body in order to protect a conductor pattern provided on the main surface of the stacked body. In contrast, in the present preferred embodiment, the protective layers 1 and 2 are disposed at positions (positions to cover at least the bent portions CP1 and CP2) other than the connection portions CN1 and CN2 on the main surfaces. According to such a configuration, since the protective layer being a coverlay film is not disposed on the entire or substantially the entire main surface, the efficiency of using a raw material for the coverlay film is improved, and the cost is able to be reduced.

(c) In addition, in the present preferred embodiment, the protective layers 1 and 2 are not in contact with the external connection electrodes SP1, SP2, GP11, GP12, GP21, and GP22. In a case in which the protective layers 1 and 2 are in contact with the external connection electrodes SP1, SP2, GP11, GP12, GP21, and GP22, or cover at least a portion of the surfaces, not only the mountability of the multilayer resin substrate is reduced, but also the multilayer resin substrate may interfere with other components of the electronic device. Therefore, according to this configuration, bonding failure or the like of the multilayer resin substrate is significantly reduced or prevented, and the mountability is improved.

(d) In the present preferred embodiment, the protective layers 1 and 2 are respectively provided on the two main surfaces (the first main surface VS1 and the second main surface VS2) to cover at least the bent portions CP1 and CP2. According to this configuration, even when either of the two main surfaces is bent to be inside, a multilayer resin substrate capable of significantly reducing or preventing a crack or the like of a conductor pattern located at the bent portions CP1 and CP2 is able to be provided.

(e) In addition, in the present preferred embodiment, the thickness of the second resin layer 20 of the protective layers 1 and 2 is less than the thickness of the third resin layer 30. In a typical coverlay film including an adhesive layer, the thickness of the adhesive layer (the second resin layer) is greater than the thickness of a film material (the third resin layer) so as to follow the outline of the conductor pattern in order to protect the conductor pattern provided on the main surface of the stacked body. In contrast, in the multilayer resin substrate 101, the conductor pattern located at the bent portions CP1 and CP2 is provided inside the stacked body 10, so that the thickness of the adhesive layer (the second resin layer 20) is able to be reduced. Therefore, with this configuration, the multilayer resin substrate is able to be easily bent since the thickness of the bent portion of the multilayer resin substrate is able to be reduced. When the thickness of the protective layers 1 and 2 is large, the conductor pattern located at the bent portions CP1 and CP2 is brought much closer to an inner layer (a neutral surface), which is able to significantly reduce or prevent a crack or the like of the conductor pattern due to bending of the stacked body 10, but makes it difficult to bend the multilayer resin substrate. In contrast, according to this configuration, even in a case in which the multilayer resin substrates have the same or substantially the same thickness, a volume ratio of the third resin layer 30 with high flexibility is increased, which makes is easy to bend the multilayer resin substrate in comparison with a case in which the thickness of the second resin layer 20 is greater than the thickness of the third resin layer.

The multilayer resin substrate 101 according to the present preferred embodiment is manufactured by, for example, the following manufacturing method.

First, the plurality of first resin layers 11, 12, 13, and 14 are prepared. The plurality of first resin layers 11 to 14 are sheets made of a thermoplastic resin such as a liquid crystal polymer (LCP) or polyetheretherketone (PEEK), for example, as a main material.

Subsequently, a conductor pattern is formed on each of the plurality of first resin layers 11 to 14. Specifically, metal foil (Cu foil, for example) is laminated on a back surface of the first resin layers 11 to 14, and is patterned by, for example, photolithography. As a result, the external connection electrodes SP1, SP2, GP11, GP12, GP21, and GP22 are formed on the back surface of the first resin layer 11, the signal conductors 41 and 42 and the ground conductor 51 are formed on the back surface of the first resin layer 12, the signal conductor 40 and the ground conductors 53 and 54 are formed on the back surface of the first resin layer 13, and the ground conductor 52 is formed on the back surface of the first resin layer 14.

This step of forming a conductor pattern on either of the first resin layers 11 to 14 is an example of a "conductor pattern forming step".

In addition, the interlayer connection conductors V1, V2, V3, and V4 and the plurality of interlayer connection conductors VG1, VG2, and VG3 are formed in the first resin layers 11 to 13, respectively. The interlayer connection conductors are provided by forming a hole (a through hole) in each of the plurality of first resin layers 11 to 13, providing (filling) the hole with a conductive bonding material including metal powder including, for example, Cu and Sn or an alloy including Cu and Sn, and a resin material, and then solidifying the conductive bonding material through a subsequent heating and pressing process.

Subsequently, the plurality of first resin layers 11, 12, 13, and 14 are stacked (placed) in order of the first resin layer 11, the first resin layer 12, the first resin layer 13, and the first resin layer 14 so that the conductor patterns (the signal conductor 40 and the ground conductors 51 and 52) located at the portion to later be a bent portion, among the conductor patterns, may be disposed inside. Then, the stacked first resin layers 11 to 14 are heated and pressed (collectively pressed) to form the stacked body 10.

This step of forming the stacked body 10 by stacking, heating, and pressing the plurality of first resin layers 11 to 14 so that the conductor patterns located at the portion to later be a bent portion may be disposed inside after the conductor pattern forming step is an example of a "stacked body forming step".

Subsequently, the protective layer 1 is formed (attached) on the first main surface VS1 of the stacked body 10, and the protective layer 2 is formed (attached) on the second main surface VS2 of the stacked body 10. Specifically, the protective layers 1 and 2 include the second resin layer 20 (an adhesive layer) made of, for example, a thermosetting resin, and the third resin layer 30, and the third resin layer 30 of the protective layers 1 and 2 is attached to the main surface of the stacked body 10 through the second resin layer 20 and then heated to cure the second resin layer 20. The third resin layer 30 is more flexible (Young's modulus is low) than the cured second resin layer 20. The protective layers 1 and 2 are coverlay films including an adhesive tape, for example. In addition, the second resin layer 20 is an adhesive layer such as an epoxy resin, for example, and the third resin layer 30 is a sheet made of polyimide, for example.

The protective layers 1 and 2 are disposed at positions to cover at least portions to be the bent portions CP1 and CP2 when the stacked body 10 is later bent. In addition, the protective layers 1 and 2 are not disposed (are not contact with the external connection electrodes SP1, SP2, GP11, GP12, GP21, and GP22) near the external connection electrodes SP1, SP2, GP11, GP12, GP21, and GP22.

This step of forming the protective layers 1 and 2 including the second resin layer 20 made of a thermosetting resin at positions to cover portions of the main surface to later be bent portions after the stacked body forming step is an example of a "protective layer forming step".

Next, the plug 61 is mounted on the first main surface VS1 of the connection portion CN1. The plug 61 is connected to the external connection electrodes SP1, GP11, and GP12 through a conductive bonding material such as solder, for example.

Subsequently, a line portion SL of the stacked body 10 is bent into an S shape. As a result, the plurality of bent portions CP1 and CP2 are provided at the line portion SL.

The step of forming a bent portion after bending a stacked body after the protective layer forming step is an example of a "bent portion forming step".

According to this above-described non-limiting example of a manufacturing method, in a configuration in which a protective layer is provided on a surface of a stacked body, even when the protective layer is cracked during bending processing, a multilayer resin substrate capable of significantly reducing or preventing variations in electrical characteristics is able to be easily formed.

According to the above-described non-limiting example of a manufacturing method, the plurality of first resin layers 11 to 14 made of a thermoplastic resin as a main material are stacked, and heated and pressed (collectively pressed) to easily form the stacked body 10, which reduces the number of manufacturing steps and thus reduces the cost. In a case in which a stacked body in which a portion to be a bent portion is thicker than other portions is provided, a manufacturing process may become more complicated, such as preparing a plurality of first resin layers with different shapes. In contrast, according to the manufacturing method, the multilayer resin substrate in which the thickness of the bent portion is increased is easily obtained simply by forming (attaching) a protective layer on the main surface of a stacked body.

In addition, according to the above-described non-limiting example of a manufacturing method, a hole provided in a resin layer is provided with a conductive bonding material (conductive paste), and the conductive bonding material is able to be solidified by heating and pressing (collective pressing), so that the number of steps of forming an interlayer connection conductor is able to be reduced.

Further, as shown in the above-described non-limiting example of a manufacturing method, the protective layers 1 and 2 are preferably not disposed near the external connection electrodes SP1, SP2, GP11, GP12, GP21, and GP22. A flexible coverlay film is likely to be deformed or displaced when attached to the surface of the stacked body, resulting in low patterning accuracy. Therefore, the coverlay film, in a case of being attached near the external connection electrode, covers a surface (or a portion on which a connector is mounted) of the external connection electrode, which may cause the multilayer resin substrate to interfere with other components or may reduce the mount ability.

It is to be noted that the "bent portion" refers to, for example, a region surrounded by a portion in which the curvature of each of the first main surface VS1 and the second main surface VS2 of the stacked body at a bent portion is zero.

Second Preferred Embodiment

A second preferred embodiment of the present invention provides an example of a multilayer resin substrate in which a plurality of bent portions are provided and a protective layer is independently provided for each bent portion.

Figure 5A:
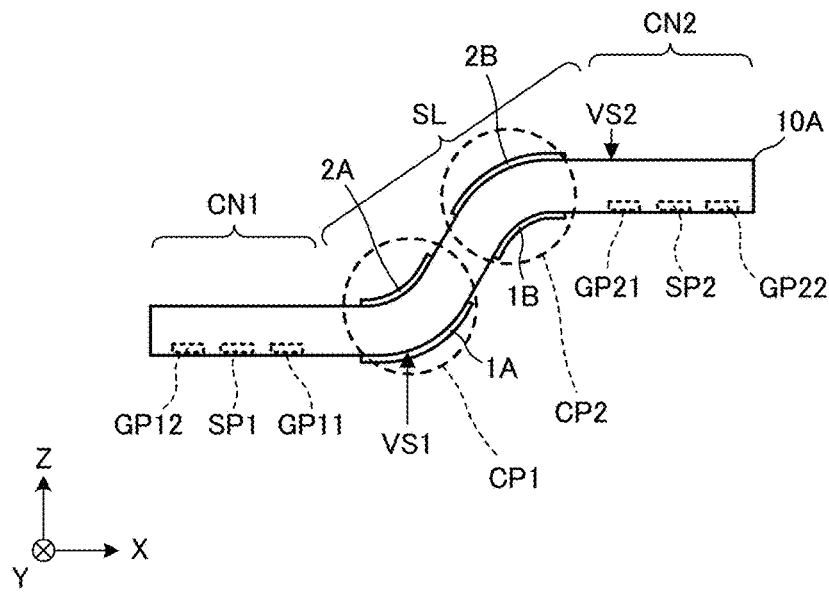
FIG. 5A is a front view of a multilayer resin substrate 102 according to a second preferred embodiment of the present invention.
Figure 5B:
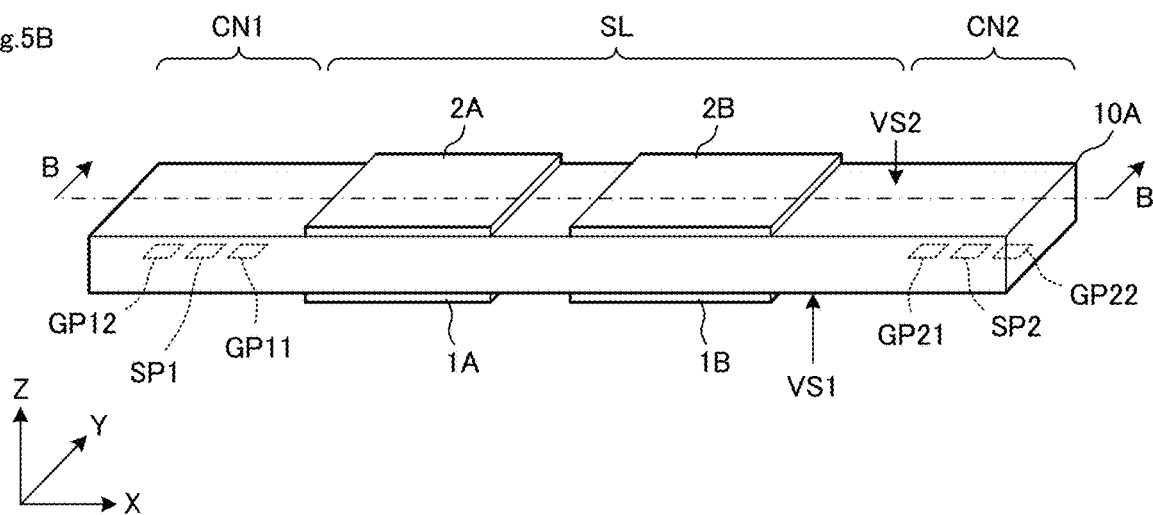
FIG. 5B is an external perspective view showing a state before the multilayer resin substrate 102 is bent.
Figure 7:
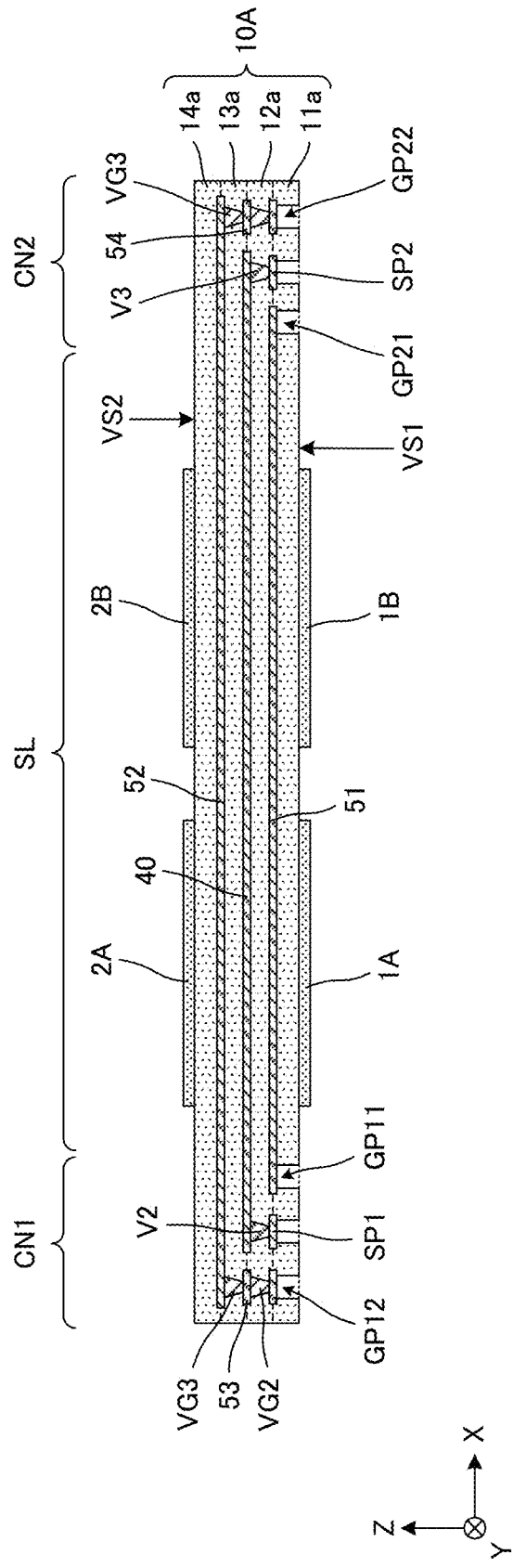
FIG. 7 is a B-B cross-sectional view in FIG. 5B.

FIG. 5A is a front view of a multilayer resin substrate 102 according to the second preferred embodiment, and FIG. 5B is an external perspective view showing a state before the multilayer resin substrate 102 is bent. FIG. 6 is an exploded plan view of the multilayer resin substrate 102. FIG. 7 is a B-B cross-sectional view in FIG. 5B.

The multilayer resin substrate 102 according to the present preferred embodiment is an electronic component that is surface-mounted on a circuit board having a level difference, for example.

The multilayer resin substrate 102 is different from the multilayer resin substrate 101 according to the first preferred embodiment in that a stacked body 10A and a plurality of protective layers 1A, 1B, 2A, and 2B are included. In addition, the multilayer resin substrate 102 is different from the multilayer resin substrate 101 in that external connection electrodes SP1, SP2, GP11, GP12, GP21, and GP22 are provided inside the stacked body 10A. Other configurations of the multilayer resin substrate 102 are the same or substantially the same as the configurations of the multilayer resin substrate 101.

Hereinafter, differences from the multilayer resin substrate 101 according to the first preferred embodiment will be described.

The stacked body 10A is provided by stacking a plurality of first resin layers 11a, 12a, 13a, and 14a, in this order. The outer shape of the stacked body 10A is the same or substantially the same as the outer shape of the stacked body 10 described in the first preferred embodiment. The configurations of the first resin layers 11a to 14a are the same or substantially the same as the configurations of the first resin layers 11 to 14 described in the first preferred embodiment.

In the present preferred embodiment, the first resin layer 11a corresponds to an "outermost layer including a main surface", and the first resin layer 12a corresponds to an "adjacent layer adjacent to the outermost layer".

A plurality of opening portions AS1, AS2, AG11, AG12, AG21, and AG22 are provided in the first resin layer 11a. The opening portions AS1, AG11, and AG12 are through holes disposed in the vicinity of a first end (a left end of the first resin layer 11a in FIG. 6) of the first resin layer 11a. The opening portions AS2, AG21, and AG22 are through holes disposed in the vicinity of a second end (a right end of the first resin layer 11a in FIG. 6) of the first resin layer 11a.

The opening portions AS1 and AS2 provided in the first resin layer 11a are disposed at positions respectively corresponding to the external connection electrode SP1 and SP2 (to be described in detail later) provided on a back surface of the first resin layer 12a. Therefore, even in a case in which the first resin layer 11 is stacked on a surface of the first resin layer 12, the external connection electrodes SP1 and SP2 are exposed from the opening portions AS1 and AS2 to the outside. In addition, the opening portions AG11, AG12, AG21, and AG22 provided in the first resin layer 11a are disposed at positions corresponding to a ground conductor 51 (to be described in detail later) provided on the back surface of the first resin layer 12a. Therefore, even in a case in which the first resin layer 11 is stacked on a surface of the first resin layer 12, portions of the ground conductor 51 are exposed from the opening portions AG11, AG12, AG21, and AG22 to the outside. In the present preferred embodiment, the portions of the ground conductor 51 exposed from the opening portions AG11, AG12, AG21, and AG22 are the external connection electrodes GP11, GP12, GP21, and GP22, respectively.

The external connection electrodes SP1 and SP2 and the ground conductor 51 are provided on the back surface of the first resin layer 12a. The external connection electrode SP1 is a rectangular or substantially rectangular conductor pattern disposed in the vicinity of a first end (a left end of the first resin layer 12a in FIG. 6) of the first resin layer 12a. The external connection electrode SP2 is a rectangular or substantially rectangular conductor pattern disposed in the vicinity of a second end (a right end of the first resin layer 12a in FIG. 6) of the first resin layer 12a. The ground conductor 51 is the same or substantially the same as the ground conductor described in the first preferred embodiment.

In addition, interlayer connection conductors V2 and V3 and a plurality of interlayer connection conductors VG2 are provided in the first resin layer 12a. The interlayer connection conductors V2, V3, and VG2 are the same or substantially the same as the interlayer connection conductors described in the first preferred embodiment.

A signal conductor 40 and ground conductors 53 and 54 are provided on a back surface of the first resin layer 13a. In addition, a plurality of interlayer connection conductors VG3 are provided in the first resin layer 13a. The signal conductor 40, the ground conductors 53 and 54, and the interlayer connection conductor VG3 are the same or substantially the same as the conductors described in the first preferred embodiment.

A ground conductor 52 is provided on a back surface of the first resin layer 14a. The ground conductor 52 is the same or substantially the same as the ground conductor described in the first preferred embodiment.

As mainly shown in FIG. 7, the external connection electrodes SP1, SP2, GP11, GP12, GP21, and GP22 are disposed on a boundary surface between the first resin layer 11a (the outermost layer) and the first resin layer 12a (the adjacent layer), and exposed from the opening portions (AS1, AS2, AG11, AG12, AG21, AG22) provided in the first resin layer 11a, to the outside.

Protective layers 1A, 1B, 2A, and 2B are disposed at positions to cover respectively different bent portions on the main surface. Specifically, the protective layer 1A is disposed at a position to cover the bent portion CP1 on the first main surface VS1, and the protective layer 1B is disposed at a position to cover the bent portion CP2 on the first main surface VS1. In addition, the protective layer 2A is disposed at a position to cover the bent portion CP1 on the second main surface VS2, and the protective layer 2B is disposed at a position to cover the bent portion CP2 on the second main surface VS2.

The external connection electrodes SP1 and SP2 are electrically connected to each other. Specifically, the external connection electrode SP1 is connected to the first end of the signal conductor 40 through the interlayer connection conductor V2. The second end of the signal conductor 40 is connected to the external connection electrode SP2 through the interlayer connection conductor V3. In addition, the ground conductor 51 (the external connection electrodes GP11, GP12, GP21, GP22) and the ground conductor 52 are electrically connected to each other through the ground conductors 53 and 54 and the interlayer connection conductors VG2 and VG3.

Figure 8:
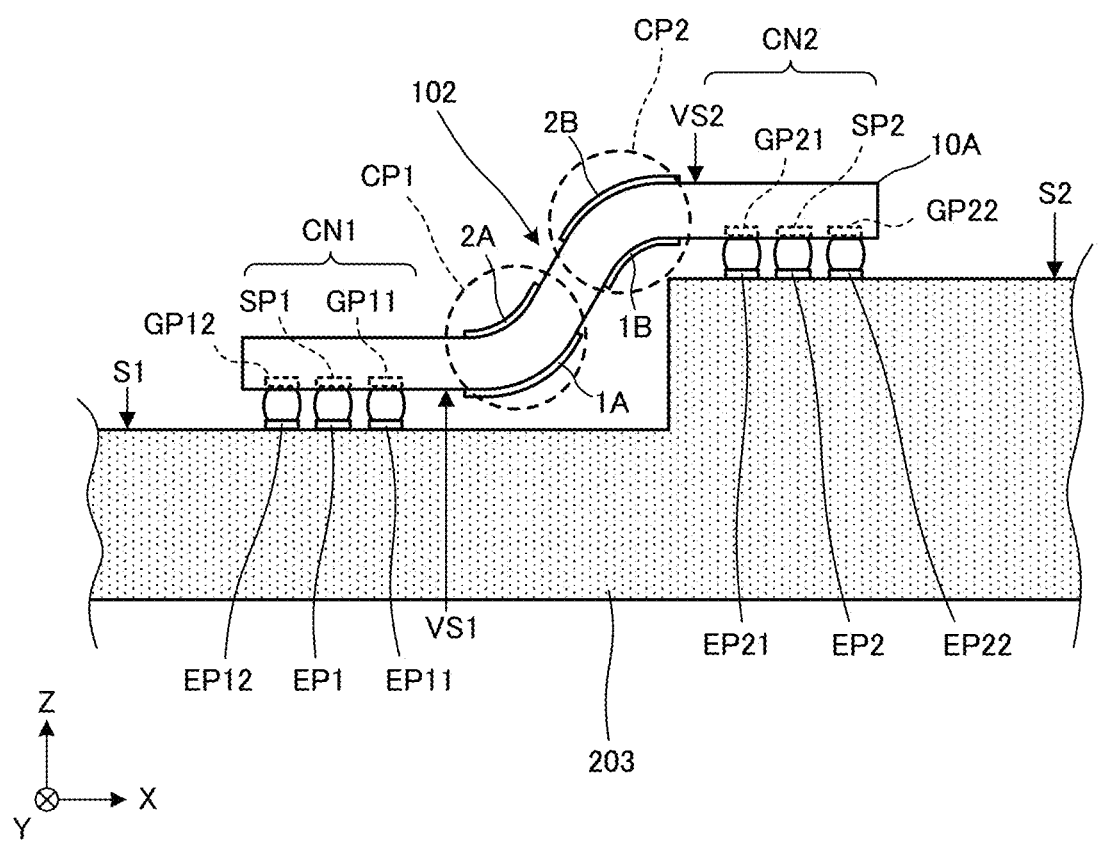
FIG. 8 is a front view showing a main portion of an electronic device 302 according to the second preferred embodiment of the present invention.

The multilayer resin substrate 102 is used, for example, as follows. FIG. 8 is a front view showing a main portion of an electronic device 302 according to the second preferred embodiment.

The electronic device 302 includes the multilayer resin substrate 102 and a circuit board 203. The circuit board 203 includes a first surface S1 and a second surface S2. As shown in FIG. 8, both of the first surface S1 and the second surface S2 are parallel or substantially parallel to the XY plane, and have different heights in the Z-axis direction. External electrodes EP1, EP11, and EP12 are provided on the first surface S1 of the circuit board 203, and external electrodes EP2, EP21, and EP22 are provided on the second surface S2.

The connection portions CN1 and CN2 of the multilayer resin substrate 102 are mounted on the circuit board 203. Specifically, the external connection electrodes SP1, GP11, and GP12 of the multilayer resin substrate 102 are respectively connected to the external electrodes EP1, EP11, and EP12 of the circuit board 203 through the conductive bonding material. In addition, the external connection electrodes SP2, GP21, and GP22 of the multilayer resin substrates 102 are respectively connected to the external electrodes EP2, EP21, and EP22 of the circuit board 203 through the conductive bonding material.

As described above, the multilayer resin substrate of preferred embodiments of the present invention may be mounted on the circuit board having a level difference portion (having surfaces of the heights are different from each other).

The multilayer resin substrate 102 according to the present preferred embodiment is manufactured by, for example, the following manufacturing method.

First, the plurality of first resin layers 11a, 12a, 13a, and 14a are prepared, and then a conductor pattern is formed on each of the plurality of first resin layers 12a to 14a (a conductor pattern forming step). Specifically, metal foil (Cu foil, for example) is laminated on a back surface of the first resin layers 12a to 14a, and is patterned by, for example, photolithography. As a result, the external connection electrodes SP1 and SP2 and the ground conductor 51 are provided on the back surface of the first resin layer 12a, the signal conductor 40 and the ground conductors 53 and 54 are provided on the back surface of the first resin layer 13a, and the ground conductor 52 is provided on the back surface of the first resin layer 14a. In addition, the interlayer connection conductors V2 and V3 and the plurality of interlayer connection conductors VG2 and VG3 are provided in the first resin layers 12a and 13a, respectively.

Further, the opening portions AS1, AS2, AG11, AG12, AG21, and AG22 are formed in the first resin layer 11a. The opening portions AS1 and AS2 are through holes disposed at positions respectively corresponding to the external connection electrodes SP1 and SP2 when the first resin layers 11a to 14a are stacked. The opening portions AG11, AG12, AG21, and AG22 are through holes disposed at positions corresponding to the ground conductor 51 when the first resin layers 11a to 14a are stacked. The opening portions are formed, for example, by laser processing or by die cutting, such as punching.

Subsequently, the plurality of first resin layers 11a, 12a, 13a, and 14a are stacked in order of the first resin layer 11a, the first resin layer 12a, the first resin layer 13a, and the first resin layer 14a, and the stacked first resin layers 11a to 14a are heated and pressed (collectively pressed) to form the stacked body 10A (a stacked body forming step).

The external connection electrodes SP1 and SP2 disposed on a boundary surface between the first resin layers 11a and 12a are exposed to the outside by the opening portions AS1 and AS2. In addition, portions of the ground conductor 51 exposed from the opening portions AG11, AG12, AG21, and AG22 to the outside are the external connection electrodes GP11, GP12, GP21, and GP22, respectively.

Subsequently, the protective layers 1A and 1B are formed on the first main surface VS1 of the stacked body 10A, and the protective layers 2A and 2B are formed on the second main surface VS2 of the stacked body 10A (a protective layer forming step). The protective layers 1A and 2A are disposed at positions to cover a portion to be the bent portion CP1 when the stacked body 10A is later bent. The protective layers 1B and 2B are disposed at positions to cover a portion to be the bent portion CP2 when the stacked body 10A is later bent.

Subsequently, a line portion SL of the stacked body 10A is bent into an S shape. As a result, the plurality of bent portions CP1 and CP2 are provided at the line portion SL (a bent portion forming step).

According to the present preferred embodiment, the following advantageous effects in addition to the advantageous effects described in the first preferred embodiment are obtained.

In the present preferred embodiment, the plurality of protective layers 1A, 1B, 2A, and 2B are disposed at positions to respectively cover different bent portions on the same main surface. In short, in the present preferred embodiment, a different protective layer is provided for each of the bent portions CP1 and CP2. In a case in which a large protective layer that covers a plurality of bent portions is provided, the effect of bending stress generated in one bent portion may spread over a wide area (another bent portion or the entire or substantially the entire portion in which the protective layer is provided) through the protective layer. In contrast, according to the present preferred embodiment, a different protective layer is provided for each of the plurality of bent portions CP1 and CP2, so that the bending stress generated in one bent portion is unlikely to spread over a wide area through the protective layer.

Third Preferred Embodiment

A third preferred embodiment of the present invention provides an example of a multilayer resin substrate in which a protective layer is provided only on the second main surface.

Figure 9A:
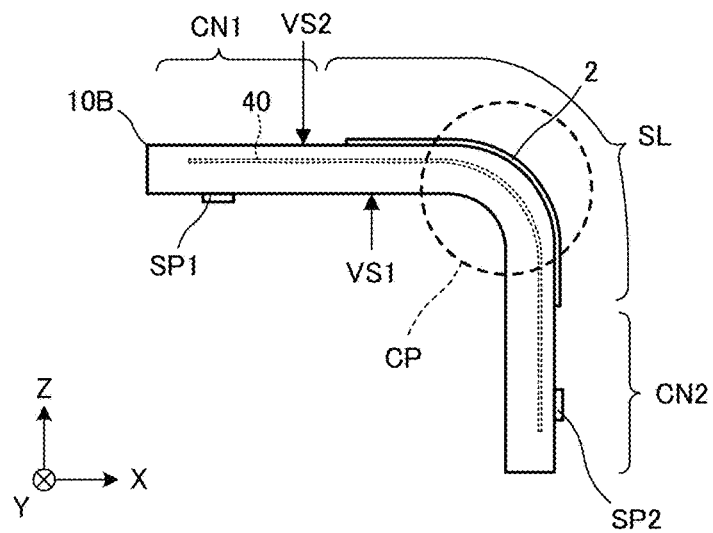
FIG. 9A is a front view of a multilayer resin substrate 103 according to a third preferred embodiment of the present invention.
Figure 9B:
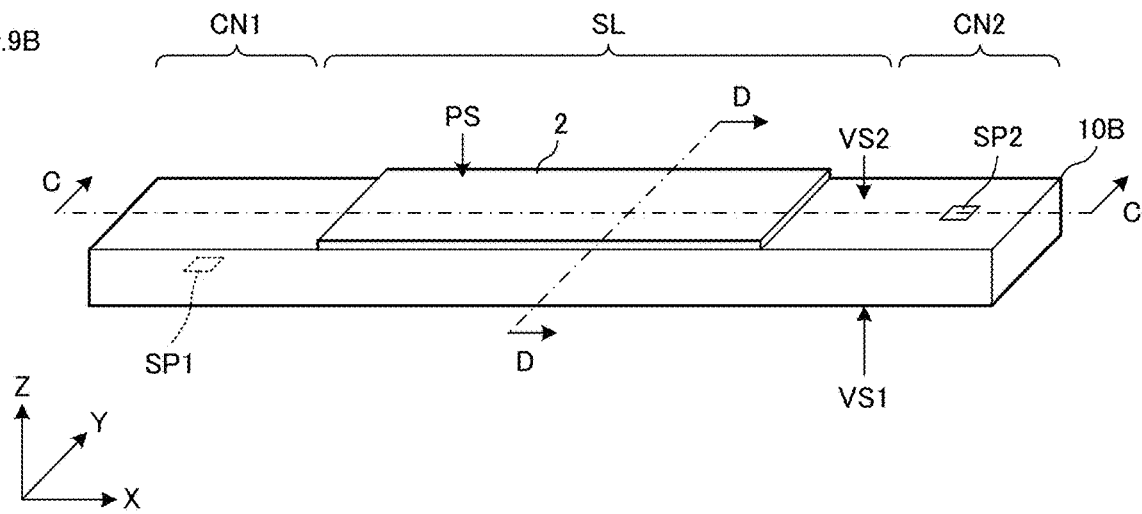
FIG. 9B is an external perspective view showing a state before the multilayer resin substrate 103 is bent.

FIG. 9A is a front view of a multilayer resin substrate 103 according to the third preferred embodiment of the present invention, and FIG. 9B is an external perspective view showing a state before the multilayer resin substrate 103 is bent. FIG. 10 is an exploded plan view of the multilayer resin substrate 103. FIG. 11A is a C-C cross-sectional view in FIG. 9B, and FIG. 11B is a D-D cross-sectional view in FIG. 9B.

The multilayer resin substrate 103 includes a stacked body 10B, a conductor pattern (a signal conductor 40 and external connection electrode SP1 and SP2), interlayer connection conductors V1, V2, and V3, and a protective layer 2. The multilayer resin substrate 103 is different from the multilayer resin substrate 101 according to the first preferred embodiment in that the ground conductors 51 to 54, the external connection electrodes GP11, GP12, GP21, and GP22, and the protective layer 1 are not provided. In addition, the multilayer resin substrate 103 is different from the multilayer resin substrate 101 in that the stacked body 10B is bent into an L shape. Other configurations of the multilayer resin substrate 103 are the same or substantially the same as the configurations of the multilayer resin substrate 101.

Hereinafter, differences from the multilayer resin substrate 101 according to the first preferred embodiment will be described.

The outer shape of the stacked body 10B before being bent is the same or substantially the same as the outer shape of the stacked body 10 described in the first preferred embodiment. As shown in FIG. 9A, the stacked body 10B is bent into an L shape. Specifically, the stacked body 10B includes a bent portion CP in the line portion SL. The bent portion CP is bent in the stacking direction so that the first main surface VS1 may be inside.

The stacked body 10B includes a plurality of first resin layers 11b, 12b, and 13b that are stacked in this order. The configurations of the first resin layers 11b to 13b are the same or substantially the same as the configurations of the first resin layers 11 to 13 described in the first preferred embodiment.

An external connection electrode SP1 is provided on a back surface of the first resin layer 11b. In addition, a plurality of interlayer connection conductors V1 are provided in the first resin layer 11b. The configurations of the external connection electrode SP1 and the interlayer connection conductors V1 are the same or substantially the same as the configurations of the electrode and the interlayer connection conductors described in the first preferred embodiment.

A signal conductor 40 is provided on a front surface of the first resin layer 12b. In addition, a plurality of interlayer connection conductors V2 are provided in the first resin layer 12b. The configurations of the signal conductor 40 and the interlayer connection conductors V2 are the same or substantially the same as the configurations of the signal conductor and the interlayer connection conductors described in the first preferred embodiment.

An external connection electrode SP2 is provided on a front surface of the first resin layer 13b. The external connection electrode SP2 is a rectangular or substantially rectangular conductor pattern disposed in the vicinity of a second end (a left end of the first resin layer 13b in FIG. 10) of the first resin layer 13b. In addition, the interlayer connection conductor V3 is provided in the first resin layer 13b. The interlayer connection conductor V3 is the same or substantially the same as the interlayer connection conductor described in the first preferred embodiment.

The external connection electrodes SP1 and SP2 are electrically connected to each other. Specifically, the external connection electrode SP1 is connected to the first end of the signal conductor 40 through the interlayer connection conductors V1 and V2. The second end of the signal conductor 40 is connected to the external connection electrode SP2 through the interlayer connection conductor V3.

As shown in FIG. 9A, the signal conductor 40 located at the bent portion CP in the conductor pattern is disposed at a position closer to the second main surface VS2 than to the first main surface VS1 of the stacked body 10B.

The second resin layer 20 when the protective layer 2 is attached to the second main surface VS2 (before the second resin layer 20 is thermally cured) has fluidity. As with the present preferred embodiment, in a case in which the plurality of first resin layers 11b to 13b made of, for example, a thermoplastic resin are heated and pressed (collectively pressed) to form the stacked body 10B, a convex portion is easily produced at a portion of a surface of the stacked body 10B at which a conductor pattern is located. In contrast, according to the present preferred embodiment, as shown in FIG. 11B, even in a case in which irregularities (such as irregularities due to the conductor pattern provided on the stacked body) are at a portion of the second main surface VS2 to which the protective layer 2 is attached, the second resin layer 20 having fluidity, by being pressed on and attached to the second main surface VS2, is deformed along the irregularities of the second main surface VS2. Therefore, flatness of a surface PS (a surface opposite to a back surface in contact with the second main surface VS2) of the protective layer 2 is higher than flatness of a portion of the second main surface VS2 in which the protective layer 2 is provided.

Figure 12:
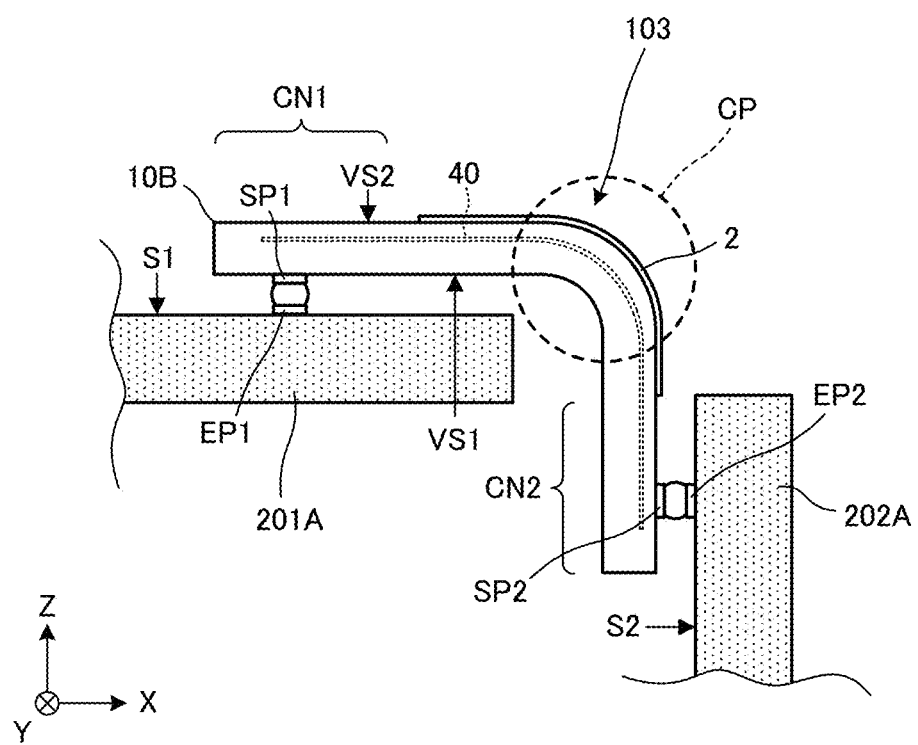
FIG. 12 is a front view showing a main portion of an electronic device 303 according to the third preferred embodiment of the present invention.

The multilayer resin substrate 103 is used, for example, as follows. FIG. 12 is a front view showing a main portion of an electronic device 303 according to the third preferred embodiment.

The electronic device 303 includes the multilayer resin substrate 103 and circuit boards 201A and 202A. The circuit board 201A includes a first surface S1, and the circuit board 202A includes a second surface S2. As shown in FIG. 12, the first surface S1 is a surface parallel or substantially parallel to the XY plane, and the second surface S2 is a surface parallel or substantially parallel to a ZY plane. In other words, the first surface S1 and the second surface S2 are perpendicular or substantially perpendicular to each other. An external electrode EP1 is provided on the first surface S1 of the circuit board 201A, and an external electrode EP2 is provided on the second surface S2 of the circuit board 202A.

The connection portions CN1 and CN2 of the multilayer resin substrate 103 are mounted on the circuit boards 201A and 202A. Specifically, the external connection electrode SP1 of the multilayer resin substrate 103 is connected to the external electrode EP1 of the circuit board 201A through a conductive bonding material. In addition, the external connection electrode SP2 of the multilayer resin substrate 103 is connected to the external electrode EP2 of the circuit board 202A through the conductive bonding material.

According to the present preferred embodiment, the following advantageous effects in addition to the advantageous effects described in the first preferred embodiment are obtained.

In the present preferred embodiment, the flatness of a surface PS of the protective layer 2 opposite to the back surface in contact with the second main surface VS2 is higher than the flatness of a portion of the second main surface VS2 in which the protective layer 2 is provided. According to this configuration, the flatness of the surface PS of the protective layer 2 is high, so that a portion in which the protective layer 2 of the multilayer resin substrate 103 before being bent is provided is easily picked up by a suction chuck. In addition, in a case in which the multilayer resin substrate is surface-mounted on the circuit board, with the main surface in which the protective layer is provided as a mounting surface, a positional shift or a fall of the multilayer resin substrate is able to be significantly reduced or prevented when the multilayer resin substrate is mounted on the circuit board. Therefore, with this configuration, accuracy of mounting the multilayer resin substrate to the circuit board or the like is able to be improved.

As shown in the present preferred embodiment, the protective layer may be configured to be provided on either one of the first main surface VS1 or the second main surface VS2. Furthermore, as with the present preferred embodiment, in a case in which the conductor pattern (the signal conductor 40) located at the bent portion CP is disposed at a position (a position closer to the one main surface) closer to another main surface (the second main surface VS2) than to one main surface (the first main surface VS1), the protective layer 2 may be provided only on the second main surface VS2 of the bent portion CP. According to this configuration, in comparison with a case in which the protective layer 2 is not provided on the second main surface VS2, the conductor pattern located at the bent portion CP is able to be disposed on a side of the inner layer (the neutral surface) in the thickness direction of the multilayer resin substrate. Therefore, the effect of the bending stress to the conductor pattern located at the bent portion CP when the multilayer resin substrate is bent is able to be significantly reduced or prevented.

While each of the above described preferred embodiments provides an example in which the stacked body is a rectangular or substantially rectangular flat plate, the present invention is not limited to such a configuration. The shape of the stacked body is able to be appropriately changed within the scope of producing the functions and advantageous effects of the present invention. The planar shape of the stacked body may be a polygon, a circle, an ellipse, an L shape, a T shape, a Y shape, a U shape, or a crank shape, for example.

While each of the above described preferred embodiments provides an example of the multilayer resin substrate including one or two bent portions at the line portion SL, the present invention is not limited to such a configuration. The number, arrangement, or the like of bent portions is able to be appropriately changed within the scope of providing the functions and advantageous effects of the present invention. The number of bent portions may be three or more. In addition, in a case in which the number of bent portions is two or more, the protective layer does not need to be disposed at a position to cover all of the bent portions, and the protective layer may be disposed at a position to cover at least one of the plurality of bent portions. Furthermore, the bent portion of the present invention is not limited to bending of the stacked body and includes a twist, for example.

In addition, the configuration of the circuit provided on the multilayer resin substrate is not limited to the configuration described in each of the above preferred embodiments, and is able to be appropriately changed within the scope of the functions and advantageous effects of the preferred embodiments of the present invention. As the circuit provided on the multilayer resin substrate, for example, a coil defined by the conductor pattern, a capacitor defined by the conductor pattern, or a frequency filter such as various filters (a low-pass filter, a high-pass filter, a band-pass filter, a band-elimination filter) may be provided. Moreover, in addition to the transmission line having a stripline structure, various transmission lines (a microstrip line, a coplanar line, or the like), for example, may be provided on the multilayer resin substrate. Furthermore, various electronic components such as chip components, for example, may be mounted on or embedded in the multilayer resin substrate.

While each of the above described preferred embodiments provides an example of the multilayer resin substrate including the two connection portions CN1 and CN2 and the one line portion SL, the number of connection portions and the number of line portions that are included in the multilayer resin substrate are able to be appropriately changed within the scope of the functions and advantageous effects of the preferred embodiments of the present invention, and the number of connection portions may be three or more, and the number of line portions may be two or more.

In addition, while each of the above described preferred embodiments provides an example of the multilayer resin substrate in which one transmission line is provided at the line portion, the number of transmission lines is also able to be appropriately changed according to a circuit board provided on the multilayer resin substrate and may be two or more. In a case in which two or more transmission lines are provided, each of the two or more transmission lines may be used in the same system (the same frequency band) or in different systems (different frequency bands).

While each of the above described preferred embodiments provides an example of the protective layer including the second resin layer 20 and the third resin layer 30, the protective layer may include only the second resin layer. In such a case, the protective layer (the second resin layer) may be made of an epoxy resin, for example, and may be applied to the surface of the stacked body.

In addition, while each of the above described preferred embodiments provides an example of the stacked body including three or four resin layers, the number of resin layers included in the stacked body is not limited to this configuration. The number of resin layers included in the stacked body may be two or may be five or more.

While each of the above described preferred embodiments provides an example in which the signal conductor 40 extends only in the X-axis direction, the present invention is not limited to this configuration. The transmission direction of the signal conductor 40 is not limited to the X-axis direction. For example, the signal conductor 40 may be a conductor pattern that bends into a C shape or an L shape, or a conductor pattern that branches into a Y shape or a T shape. In addition, the signal conductor 40 may have a crank shape, for example.

While the above described first preferred embodiment describes the multilayer resin substrate 101 in which the plug 61 is provided only on the first main surface VS1 of the connection portion CN1, the plug may be provided on the first main surface VS1 of the connection portion CN2. In addition, the plug may be provided on the second main surface VS2 of the connection portions CN1 and CN2.

Moreover, while each of the above described preferred embodiments provides an example in which the planar shape of each conductor pattern (including an external connection electrode and a ground conductor) is a rectangular or substantially rectangular shape, the present invention is not limited to such a configuration. The planar shape of each conductor pattern is able to be appropriately changed within the scope of the functions and advantageous effects of the preferred embodiments of the present invention, and may be a polygonal shape, a circular shape, an elliptical shape, an arc shape, a ring shape, an L shape, a U shape, a T shape, a Y shape, or a crank shape, for example. In addition, while each of the above described preferred embodiments provides an example in which each external connection electrode is exposed on the first main surface VS1 of the connection portion, each external connection electrode may be exposed on the second main surface VS2. The number and position of respective external connection electrodes are able to be appropriately changed within the scope of producing the functions and advantageous effects of the present invention. It is to be noted that a dummy electrode that is not connected to the signal conductor or the ground conductor other than each of the external connection electrodes may be provided on the multilayer resin substrate.

Figure 13:
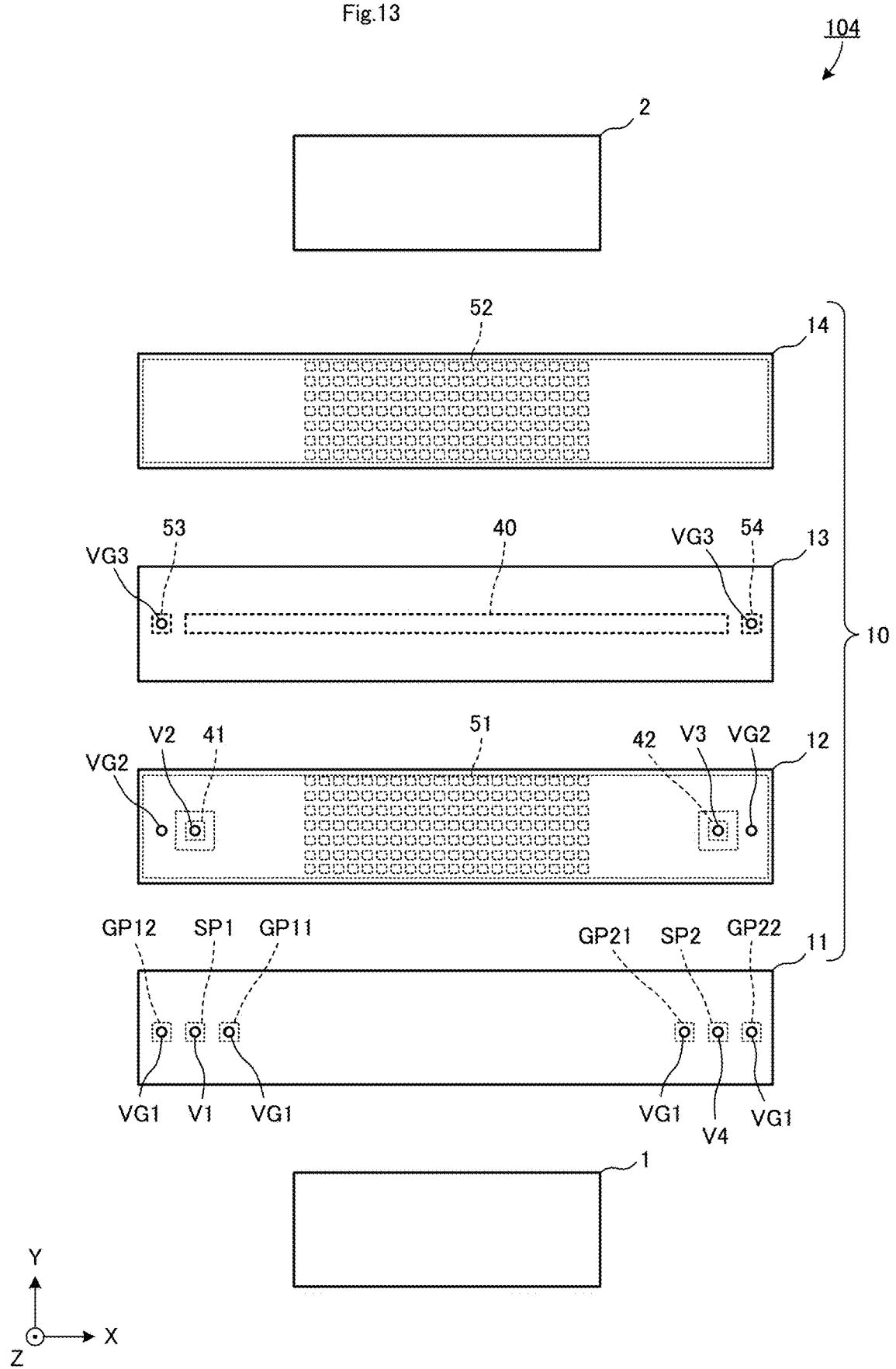
FIG. 13 is an exploded view of a multilayer resin substrate 104 according to a modification of a preferred embodiment of the present invention.

In addition, in the first preferred embodiment and the second preferred embodiment described above, the conductor patterns (the ground conductors 51 and 52) located at the bent portions CP1 and CP2, as shown in FIG. 13, preferably have a mesh shape, for example. FIG. 13 is an exploded view of a multilayer resin substrate 104 according to a modification of a preferred embodiment of the present invention. As a result, a load applied to the conductor patterns (the ground conductors 51 and 52) at the bent portions CP1 and CP2 is reduced. It is to be noted that the mesh shape includes a lattice shape and a netlike shape, for example. In addition, a portion of the ground conductors 51 and having the mesh shape, as shown in FIG. 13, is preferably covered with the protective layers 1 and 2. As a result, durability against bending of the portion of the ground conductors 51 and 52 having the mesh shape is increased.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer resin substrate comprising:
  a stacked body having a main surface and including a plurality of first resin layers that are made of a thermoplastic resin and stacked;
  one or more conductor patterns in or on the stacked body; and
  a protective layer at a portion of the main surface and including a second resin layer made of a thermosetting resin; wherein
  the stacked body includes a bent portion that is bent such that the main surface is on an inside or an outside of the bent portion;
  any conductor pattern located at the bent portion, among the one or more conductor patterns, is provided only inside the stacked body; and
  the protective layer covers at least the bent portion, on the main surface.

2. The multilayer resin substrate according to claim 1, wherein
  the conductor pattern includes an external connection electrode on the main surface; and
  the protective layer is not near the external connection electrode.

3. The multilayer resin substrate according to claim 1, wherein
  the conductor pattern includes an external connection electrode on the stacked body;
  the protective layer is not near the external connection electrode; and
  the external connection electrode is on a boundary surface between an outermost layer including the main surface, among the plurality of first resin layers, and an adjacent layer adjacent to the outermost layer, and is exposed from the opening portion in the outermost layer, to an outside.

4. The multilayer resin substrate according to claim 1, wherein the conductor pattern at the bent portion has a mesh shape.

5. The multilayer resin substrate according to claim 1, wherein
  the protective layer is adjacent to the second resin layer, and includes a third resin layer that is more flexible than the second resin layer; and
  the third resin layer is bonded to the main surface through the second resin layer.

6. The multilayer resin substrate according to claim 5, wherein a thickness of the second resin layer is less than a thickness of the third resin layer.

7. The multilayer resin substrate according to claim 5, wherein
  the first resin layer is made of a liquid crystal polymer as a main material; and
  the third resin layer is made of polyimide as a main material.

8. The multilayer resin substrate according to claim 5, wherein a flatness of a surface of the protective layer opposite to a surface in contact with the main surface is higher than a flatness of a portion of the main surface in which the protective layer is provided.

9. The multilayer resin substrate according to claim 1, wherein the protective layer includes a plurality of protective layers.

10. The multilayer resin substrate according to claim 9, wherein
  the bent portion includes a plurality of bent portions; and
  the plurality of protective layers are disposed at different bent portions, respectively, on the main surface.

11. The multilayer resin substrate according to claim 9, wherein
  the main surface includes a first main surface and a second main surface that oppose each other; and
  the plurality of protective layers are provided on the first main surface and the second main surface, respectively.

12. The multilayer resin substrate according to claim 1, wherein
  the main surface includes a first main surface and a second main surface that oppose each other;
  the conductor pattern at the bent portion is disposed at a position closer to the first main surface than to the second main surface; and
  the protective layer is provided only on the first main surface.

13. The multilayer resin substrate according to claim 1, wherein the conductor pattern includes:
  a first ground conductor;
  a second ground conductor; and
  a first signal conductor between the first ground conductor and the second ground conductor in a stacking direction of the stacked body.

14. An electronic device comprising:
  the multilayer resin substrate according to claim 1;
  a first circuit board connected to a first end of the multilayer resin substrate; and
  a second circuit board connected to a second end of the multilayer resin substrate.

15. The electronic device according to claim 14, wherein each of the first and second circuit boards is made of glass epoxy.

16. The electronic device according to claim 14, wherein
  the first circuit board includes a first surface;
  the second circuit board includes a second surface parallel or substantially parallel to the first surface; and
  the first surface and the second surface are disposed at different height in a vertical or substantially vertical direction.

* * * * *